United States Patent
Zheng et al.

(10) Patent No.: US 11,165,003 B2
(45) Date of Patent: Nov. 2, 2021

(54) ULTRAVIOLET LIGHT-EMITTING DIODE

(71) Applicant: EPILEDS TECHNOLOGIES, INC., Tainan (TW)

(72) Inventors: Wei-Pu Zheng, Tainan (TW); Fu-Yi Tsai, Tainan (TW); Ming-Sen Hsu, Tainan (TW)

(73) Assignee: EPILEDS TECHNOLOGIES, INC., Tainan (TW)

( * ) Notice: Subject to any disclaimer, the term of this patent is extended or adjusted under 35 U.S.C. 154(b) by 39 days.

(21) Appl. No.: 16/712,966

(22) Filed: Dec. 12, 2019

(65) Prior Publication Data
US 2021/0167260 A1   Jun. 3, 2021

(30) Foreign Application Priority Data
Dec. 3, 2019 (TW) .................................. 108144183

(51) Int. Cl.
*H01L 33/58* (2010.01)
*H01L 33/20* (2010.01)
*H01L 33/26* (2010.01)

(52) U.S. Cl.
CPC .............. *H01L 33/58* (2013.01); *H01L 33/20* (2013.01); *H01L 33/26* (2013.01)

(58) Field of Classification Search
CPC .......... H01L 33/58; H01L 33/20; H01L 33/26
See application file for complete search history.

(56) References Cited

U.S. PATENT DOCUMENTS

| | | | | |
|---|---|---|---|---|
| 2012/0305970 A1* | 12/2012 | Kim | ....................... | H01L 33/504 257/98 |
| 2014/0167066 A1* | 6/2014 | Kashima | .................. | H01L 33/44 257/76 |
| 2016/0027975 A1* | 1/2016 | Kitamura | ................. | H01L 33/54 438/27 |
| 2016/0247985 A1* | 8/2016 | Huang | ................ | H01L 33/0095 |
| 2017/0229612 A1* | 8/2017 | Shatalov | .............. | H01L 21/0242 |
| 2017/0271550 A1* | 9/2017 | Chiu | ........................ | H01L 33/44 |
| 2018/0351034 A1* | 12/2018 | Kuo | ......................... | H01L 33/06 |

* cited by examiner

*Primary Examiner* — Mark W Tornow
(74) *Attorney, Agent, or Firm* — CKC & Partners Co., LLC

(57) ABSTRACT

An ultraviolet light-emitting diode is disclosed. The ultraviolet light-emitting diode includes a transparent substrate, an ultraviolet illuminant epitaxial structure, and a transparent structure. The transparent substrate includes a first surface and a second surface which are opposite to each other, and a plurality of side surfaces surrounding and disposed between the first surface and the second surface. The ultraviolet illuminant epitaxial structure is disposed on the first surface of the transparent substrate. The transparent structure has a light-entering surface and a light-exiting surface which are opposite to each other. The light-entering surface of the transparent structure is adjacent to the second surface of the transparent substrate, and a refractive index of the transparent structure is between a refractive index of the transparent substrate and a refractive index of air.

14 Claims, 6 Drawing Sheets

ULTRAVIOLET LIGHT-EMITTING DIODE

RELATED APPLICATIONS

This application claims priority to Taiwan Application Serial Number 108144183, filed Dec. 3, 2019, which is herein incorporated by reference.

BACKGROUND

Field of Invention

The present invention relates to a light-emitting diode (LED). More particularly, the present invention relates to an ultraviolet LED (UV LED).

Description of Related Art

UV LEDs have attracted much attention as UV LEDs are widely applied in our daily lives such as air purification, water disinfection, and medical sterilizing. However, an AlGaN-based UV LED typically has limitations such as lower internal quantum efficiency, higher threading dislocation densities (TDDs), low extraction efficiency, and a large electric polarization field, such that applications of the UV LED are restricted.

Due to above mentioned limitations of current UV LED, enhancing light extraction efficiency has become one of the key developing areas in UV LED research works.

SUMMARY

One object of the present invention is to provide an UV LED with a transparent structure disposed between a transparent substrate and air, wherein a refractive index of the transparent structure is between a refractive index of the transparent substrate and a refractive index of air. The transparent structure significantly reduces the internal reflection of the light emitted inside the UV LED, thereby increasing light extraction of the UV LED.

Another objective of the present invention is to provide an UV LED, wherein a surface of a transparent substrate includes a plurality of three-dimensional structures. These three-dimensional structures can destruct total reflective surfaces of light inside the UV LED, such that light extraction rate of the UV LED is enhanced.

Still another objective of the present invention is to provide an UV LED, wherein a thickness of the transparent substrate is increased to make the LED to have a height greater than its length and/or width, thereby increasing a lateral light-exiting area of the UV LED and enhancing light extraction of the UV LED.

Yet another objective of the present invention is to provide an UV LED, wherein a plurality of stealth dicing marks is formed longitudinally on side surfaces of a transparent substrate by a stealth dicing method. These stealth dicing marks increase roughness of the side surfaces of the transparent substrate, such that a lateral light extraction of the UV LED is enhanced. Furthermore, with a specific arrangement of the stealth dicing marks, the dicing marks are extended to be fissures and connected to each other toward a predetermined direction during cleaving process, so that individual UV LED chips are split into a predefined shape.

To achieve aforementioned objectives, the present invention provides an UV LED including a transparent substrate, an ultraviolet illuminant epitaxial structure, and a transparent structure. The transparent substrate includes a first surface, an opposite second surface, and a plurality of side surfaces surrounding and disposed therebetween. The ultraviolet illuminant epitaxial structure is disposed on the first surface of the transparent substrate. The transparent structure includes a light-entering surface and a light-exiting surface which are opposite to each other. The light-entering surface of the transparent structure is adjacent to the second surface of the transparent substrate. A refractive index of the transparent structure is between a refractive index of the transparent substrate and a refractive index of air.

In one embodiment of the present invention, the transparent structure includes a plurality of transparent films sequentially stacked on the second surface of the transparent substrate, and the transparent films have different refractive indexes.

In another embodiment of the present invention, a thickness of the transparent structure is smaller than 1 μm, and a material of the transparent structure includes oxide, nitride, or fluoride.

In one embodiment of the present invention, the UV LED has a height greater than its length and/or width.

In one embodiment of the present invention, the side surfaces of the transparent substrate are formed with a plurality of stealth dicing marks which are arranged longitudinally.

In one embodiment of the present invention, the first surface of the transparent substrate is formed with a plurality of cavities, the cavities are repeated with a predetermined pitch; and each of the cavities includes a first inclined surface, a second inclined surface, and a bottom surface, wherein the first inclined surface and the second inclined surface respectively have a first angle and a second angle with respect to the bottom surface and are different from each other.

In one embodiment of the present invention, the second surface of the transparent substrate has a plurality of three-dimensional structures, and the three-dimensional structures have the same shape and size and are repeated with a predetermined pitch.

In another embodiment of the present invention, the three-dimensional structures are scattered on the second surface of the transparent substrate.

In one embodiment of the present invention, the three-dimensional structures are formed by diamond cutting, laser cutting, laser stealth dicing, etching, or a combination thereof.

BRIEF DESCRIPTION OF THE DRAWINGS

The invention can be more fully understood by reading the following detailed description of the embodiment, with reference made to the accompanying drawings as follows.

DETAILED DESCRIPTION

In view of that illuminating efficiency of a current UV LED is restricted, the present invention provides an UV LED effectively enhancing a lateral and/or normal light extraction efficiency, thereby significantly increases overall light-emitting volume of the UV LED.

Figure 1A:
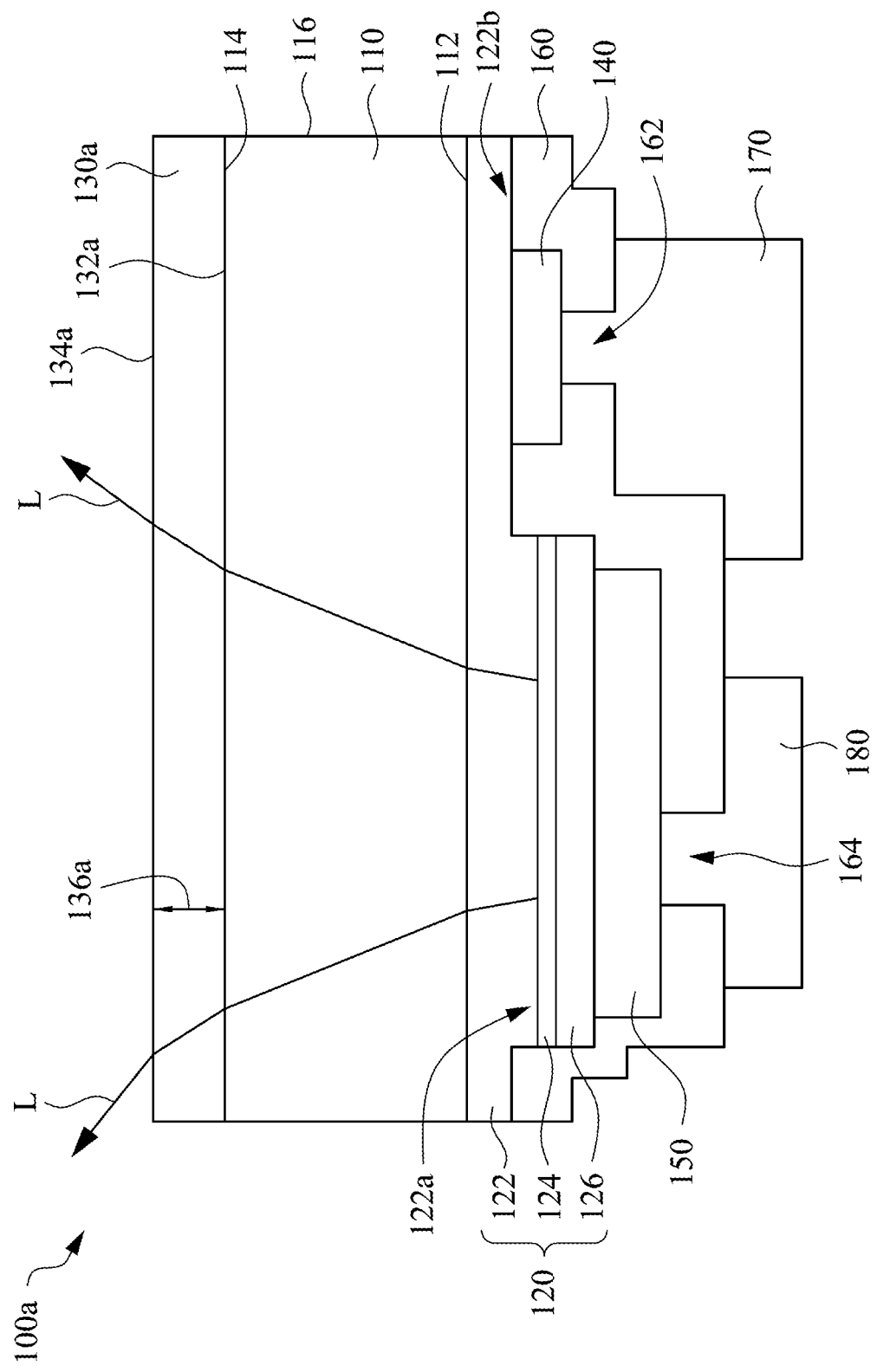
FIG. 1A is a schematic cross-sectional view of an UV LED in accordance with one embodiment of the present invention.

Referring to FIG. 1A, a schematic cross-sectional view of an UV LED in accordance with one embodiment of the present invention. An UV LED 100a may emit an ultraviolet light L having a wavelength ranging from 100 nm to 400 nm. For example, the UV LED 100a may be an UVA LED having a light emission wavelength ranging from 320 nm to 400 nm, an UVB LED having a light emission wavelength ranging from 280 nm to 320 nm, or an UVC LED having a light emission wavelength ranging from 100 nm to 280 nm. The UV LED 100a may mainly include a transparent substrate 110, an ultraviolet illuminant epitaxial structure 120, and a transparent structure 130a.

The transparent substrate 100 includes a first surface 112, a second surface 114, and several side surfaces 116. The first surface 112 and the second surface 114 are respectively located on two opposite sides of the transparent substrate 110, and the side surfaces 116 surround and are disposed between the first surface 112 and the second surface 114. A material of the transparent substrate 100 may be sapphire, aluminum nitride, or silicon carbide.

The ultraviolet illuminant epitaxial structure 120 is disposed on the first surface 112 of the transparent substrate 110. The ultraviolet illuminant epitaxial structure 120 emits the ultraviolet light L. In some embodiments, the ultraviolet illuminant epitaxial structure 120 mainly includes an n-type semiconductor layer 122, an active layer 124, and a p-type semiconductor layer 126. The n-type semiconductor layer 122 is disposed on the first surface 112 of the transparent substrate 110, and the n-type semiconductor layer 122 includes a first portion 122a and a second portion 122b. The active layer 124 is located on the first portion 122a of the n-type semiconductor layer 122. The active layer 124 emits ultraviolet light L. In some embodiments, the active layer 124 may include a multiple quantum well (MQW) structure. The p-type semiconductor layer 126 is disposed on the active layer 124, such that the active layer 124 is sandwiched between the p-type semiconductor layer 126 and the first portion 122a of the n-type semiconductor layer 122. For example, a material of the n-type semiconductor layer 122 may include n-AlGaN, a material of the active layer 124 may include AlGaN or InAlGaN, and a material of the p-type semiconductor layer 126 may include p-AlGaN. In some embodiments, the ultraviolet illuminant epitaxial structure 120 may also include a buffer layer (not shown) and a superlattice structure (not shown), in which the buffer layer and the superlattice structure are located between the transparent substrate 110 and the n-type semiconductor 122, and the buffer layer is located between the first surface 112 of the transparent substrate 110 and the superlattice structure.

Still referring to FIG. 1A, the transparent structure 130a is disposed on the second surface 114 of the transparent substrate 110, such that the transparent structure 130a and the ultraviolet illuminant epitaxial structure 120 are respectively located on opposite sides of the transparent substrate 110. The transparent structure 130a may be formed by, for example, plasma-enhanced chemical vapor deposition (PECVD), metal organic CVD (MOCVD), a sputter process, e-gun evaporation, or thermal deposition. The transparent structure 130a includes a light-entering surface 132a and a light-exiting surface 134a which are opposite to each other, wherein the light-entering surface 132a is adjacent to the second surface 114 of the transparent substrate 110. In this embodiment, a refractive index of the transparent structure 130a is between a refractive index of the transparent substrate 110 and a refractive index of a medium contacting with the light-exiting surface 134a. In this embodiment, the medium contacting with the light-exiting surface 134a is air. A material of the transparent structure 130a may include oxide, nitride, or fluoride, such as silicon dioxide, silicon nitride, or magnesium fluoride. A thickness 136a of the transparent structure 130a is smaller than 1 μm.

The transparent structure 130a shown in FIG. 1A is a single-layered structure. In this embodiment, the transparent structure 130a may have a constant refractive index, variable refractive index, or a gradient refractive index, i.e. the refractive index of the transparent structure 130a is decremented from the light-entering surface 132a toward the light-exiting surface 134a.

Figure 1B:
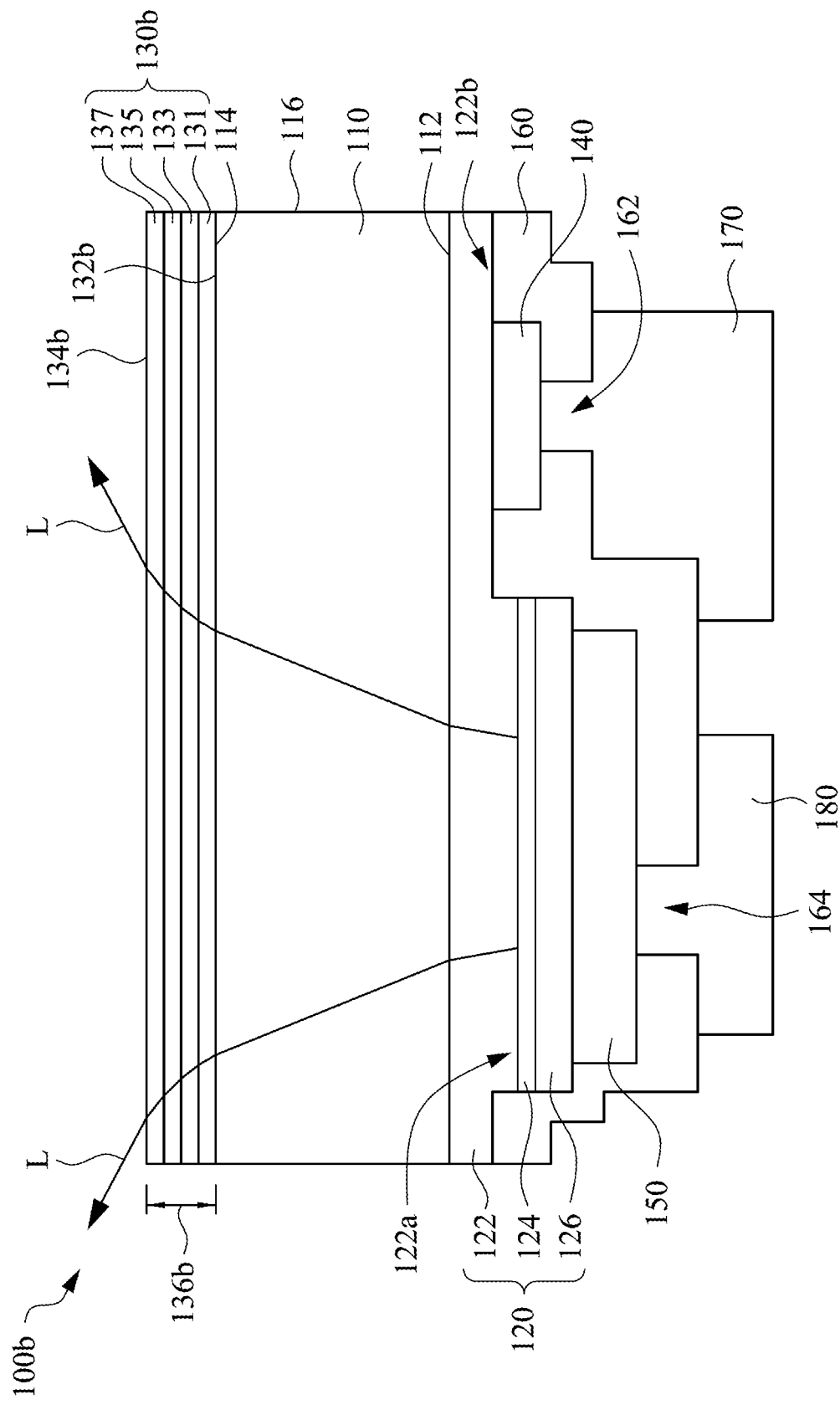
FIG. 1B is a schematic cross-sectional view of an UV LED in accordance with another embodiment of the present invention.

In other embodiments, the transparent structure may be multi-layered. Referring to FIG. 1B, a schematic cross-sectional view of the UV LED in accordance with one embodiment of the present invention. The structure of the UV LED 100b is substantially the same as that of the UV LED 100a, except a transparent structure 130b of the UV LED 100b is a multi-layered structure.

The transparent structure 130b shown in FIG. 1B may include several transparent films 131, 133, 135, and 137, wherein the transparent films 131, 133, 135, and 137 are stacked on the second surface 112 of the transparent substrate 110 in sequence. The transparent films 131, 133, 135, and 137 may be formed by, for example, PECVD, MOCVD, sputter, e-gun evaporation, or thermal deposition. In this embodiment, refractive indexes of the transparent films 131, 133, 135, and 137 are between the refractive index of the transparent substrate 110 and the refractive index of air, and are different from each other. In another embodiment, the refractive indexes of the transparent films 131, 133, 135, and 137 may be decremented from the light-entering surface 132b toward the light-exiting surface 134b of the transparent structure 130b. That is, the refractive index of the transparent film 131 is smaller than that of the transparent substrate 110 and is greater than that of the transparent film 133, the refractive index of the transparent film 133 is greater than that of the transparent film 135, and the refractive index of the transparent film 137 is smaller than that of the transparent film 135 and is greater than that of air. However, emitted UV lights may vary in other embodiments, and the corresponding transparent films 131, 133, 135 and 137 may have various combinations of refractive indexes and thicknesses to optimize the light extraction. Materials of the transparent films 131, 133, 135, and 137 may include oxide, nitride, or fluoride, such as silicon dioxide, silicon nitride, or magnesium fluoride. The thickness 136b of the transparent structure 130b is smaller than 1 μm.

Referring to FIG. 1A and FIG. 1B simultaneously, because the refractive index of the transparent structure 130a/130b is between that of the transparent substrate 110 and air, the transparent structure 130a/130b can enhance refraction of the ultraviolet light L inside the UV LED 100a/100b and effectively reduce total reflection of the ultraviolet light L inside the UV LED 100a/100b, thereby increase light extraction of the UV LED 100a/100b when the ultraviolet light L emitted by the active layer 124 passing through the n-type semiconductor layer 122 and the transparent substrate 110 and projecting into the transparent structure 130a/130b from the second surface 114 of the transparent substrate 110.

Referring to FIG. 1A and FIG. 1B, in some embodiments, the UV LED 100a may further include an n-type contact layer 140, a p-type contact layer 150, an isolation layer 160, an n-type electrode 170, and a p-type electrode 180. The n-type contact layer 140 is disposed on the second portion 122b of the n-type semiconductor layer 122, and is separated from the active layer 124 and the p-type semiconductor layer 126. The n-type contact layer 140 is an electrically conductive layer and may form an ohmic contact with the n-type semiconductor layer 122. The p-type contact layer 150 is disposed on the p-type semiconductor layer 126. The p-type contact layer 150 is an electrically conductive layer and may form an ohmic contact with the p-type semiconductor layer 126. The material of the n-type contact layer 140 and p-type contact layer 150 may include, for example, metal.

The isolation layer 160 covers the ultraviolet illuminant epitaxial structure 120, the n-type contact layer 140, and the p-type contact layer 150. The isolation layer 160 has a first hole 162 and a second hole 164, which pass through the isolation layer 160 to respectively expose a portion of the n-type contact layer 140 and a portion of the p-type contact layer 150. In some embodiments, the isolation layer 160 may have a light reflection function and may be also called as a reflective layer. The isolation layer 160 is formed from an insulation material, for example, silicon dioxide. The n-type electrode 170 is disposed on a portion of the isolation layer 160 above the n-type contact layer 140, fills the first hole 162, and is connected to the n-type contact layer 140. The material of the n-type electrode 170 may include metal such as gold (Au). The p-type electrode 180 is disposed on a portion of the isolation layer 160 above the p-type contact layer 150, fills the second hole 164, and is connected to the p-type contact layer 150. The material of the p-type electrode 180 may include metal such as gold. The n-type contact layer 170 and the p-type contact layer 180 are electrically connected to the n-type semiconductor layer 122 and the p-type semiconductor layer 126 through the n-type contact layer 140 and the p-type contact layer 150 respectively.

Figure 2:
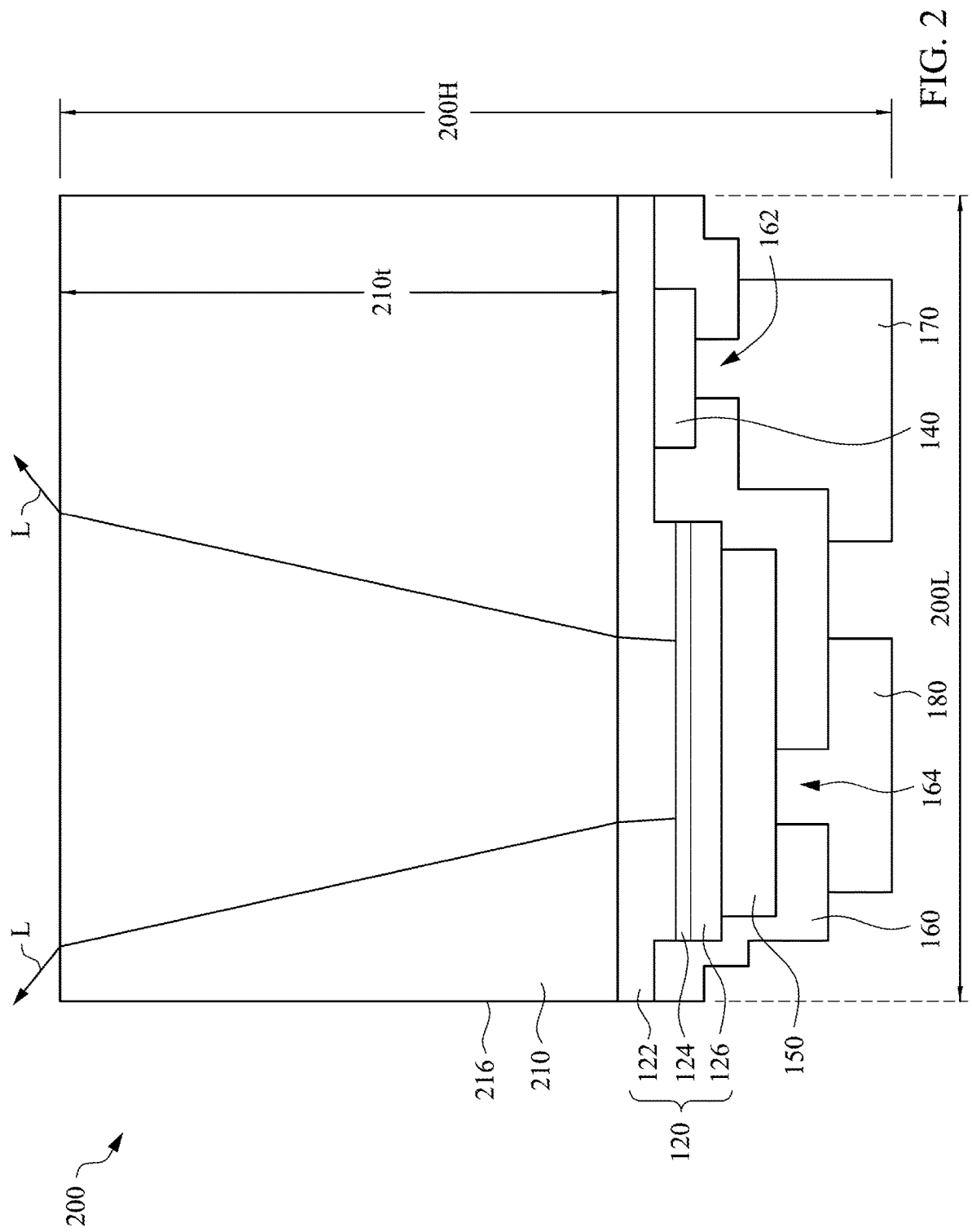
FIG. 2 is a schematic cross-sectional view of an UV LED in accordance with one embodiment of the present invention.

In addition to the aforementioned embodiments, the present invention may also use the following designs to further enhance the light extraction efficiency of the UV LED. Referring to FIG. 2, a schematic cross-sectional view of an UV LED in accordance with one embodiment of the present invention. The structure of the UV LED 200 is substantially the same as the UV LED 100a in FIG. 1A, and differences are that a transparent substrate 210 of the UV LED 200 is thicker than the transparent substrate 110 of the UV LED 100a, and there is no transparent structure disposed on the transparent substrate 210.

In this embodiment, the thickness 210t of the transparent substrate 210 is increased to make a height 200H of the UV LED 200 greater than a length 200L and/or a width (not shown).

By increasing the thickness 210t of the transparent substrate 210, heights of side surfaces 216 are increased, hence the side surfaces 216 area is increased, thereby reducing total reflection of the ultraviolet light L inside the UV LED 200. Therefore, light extraction efficiency of the UV LED 200 is enhanced.

Although the UV LED 200 shown in FIG. 2 does not have the transparent structure 130a or 130b as shown in FIG. 1A or FIG. 1B, the transparent structure 130a or 130b on the second surface 214 of the transparent substrate 210 of the UV LED 200 may be added to further enhance light extraction effect in other embodiments of the present invention.

Figure 3:
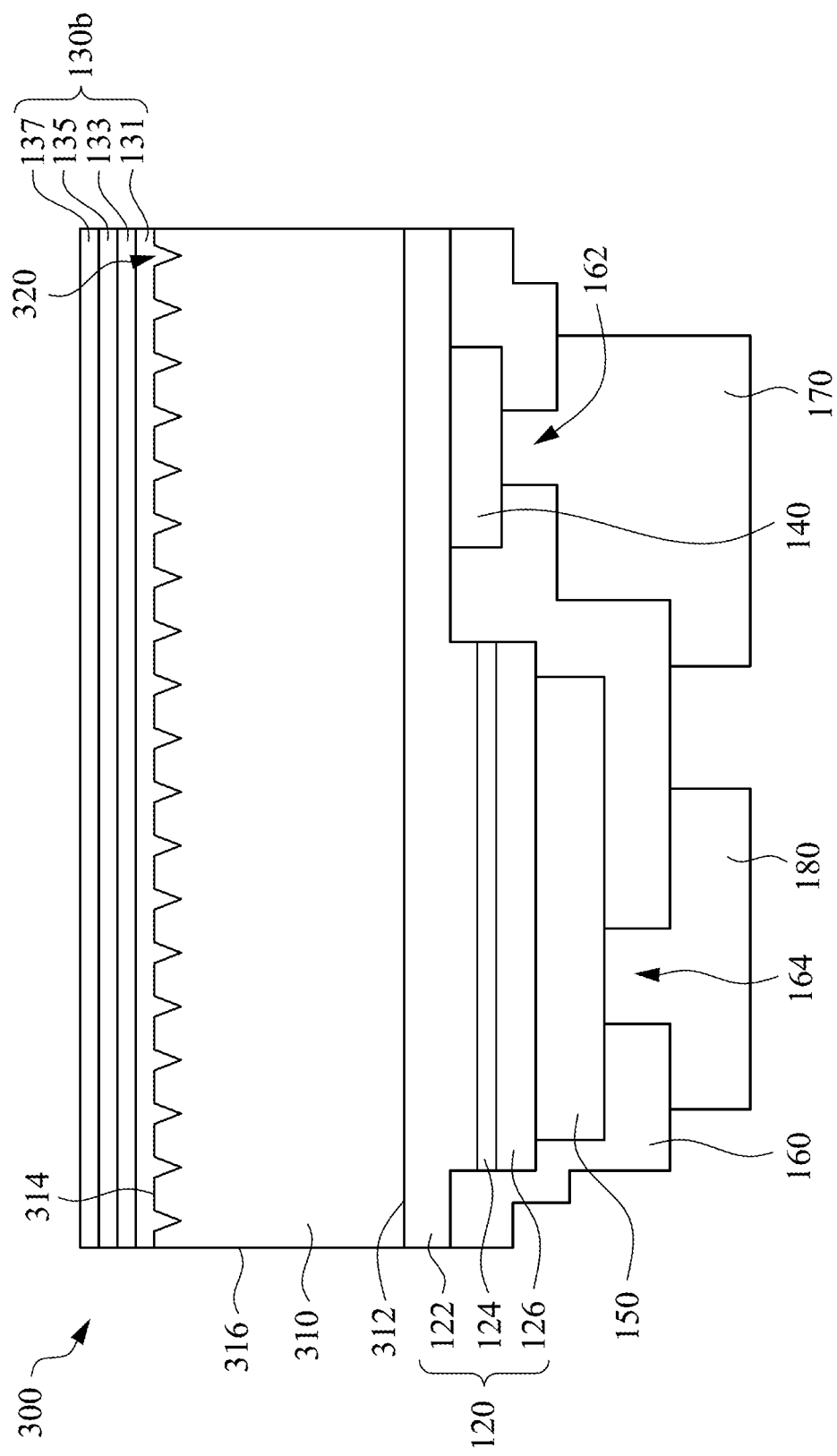
FIG. 3 is a schematic cross-sectional view of an UV LED in accordance with one embodiment of the present invention.

Referring to FIG. 3, a schematic cross-sectional view of an UV LED in accordance with one embodiment of the present invention. A structure of the UV LED 300 is substantially the same as that of the UV LED 200, and the differences are that a transparent substrate 310 of the UV LED 300 is set with a plurality of three-dimensional structures 320, and the transparent substrate 310 may be thinner than the transparent substrate 210 of the UV LED 200.

In the UV LED 300, the transparent substrate 310 similarly has a first surface 312, an opposite second surface 314, and several side surfaces 316 surrounding and disposed between the first surface 312 and the second surface 314. A material of the transparent substrate 310 may be, for example, sapphire, aluminum nitride, or silicon carbide. The ultraviolet illuminant epitaxial structure 120 is disposed on the first surface 312 of the transparent substrate 310. The three-dimensional structures 320 are disposed on the second surface 314 of the transparent substrate 310. The three-dimensional structures 320 may be formed by, for example, diamond cutting, laser cutting, laser stealth dicing, or etching. Thus, the three-dimensional structures 320 may include diamond cutting structures, laser cutting structures, laser stealth dicing structures, etching structures, or a combination thereof.

As shown in FIG. 3, the three-dimensional structures 320 may be concave structures; and in other embodiments, the three-dimensional structures 320 may be convex structures. In some embodiments, the three-dimensional structures 320 have the same shape and size, and are repeated on the second surface 314 of the transparent substrate 310 with a predetermined pitch. Alternatively, the three-dimensional structures 320 may be scattered on the second surface 314 of the transparent substrate 310. In other embodiments, shapes of the three-dimensional structures 320 are different from each other. The three-dimensional structures 320 may be in shapes of triangle, square, rectangle, polygon, circle, or ellipse.

The three-dimensional structures 320 disposed on the second surface 314 of the transparent substrate 310 can destroy total reflection of the ultraviolet light, such that refraction of the ultraviolet light inside the UV LED 300 is increased, and total reflection of the ultraviolet light on second surface 314 of the transparent substrate 310 is decreased, thereby enhancing light extraction efficiency of the UV LED 300.

Although the UV LED 300 shown in FIG. 3 does not have the transparent structure 130a or 130b as shown in FIG. 1A or FIG. 1B, and the thickness of the transparent substrate 310 is not increased, these features may be added in other embodiments of the present invention. That is, the transparent structure 130a or 130b to be added on the second surface 314 of the transparent substrate 310 of the UV LED 300, and/or the thickness of the transparent substrate 310 is increased to further enhance light extraction effect of the UV LED 300. The transparent structure 130a or 130b may cover the three-dimensional structures 320 of the transparent substrate 310.

Figure 4:
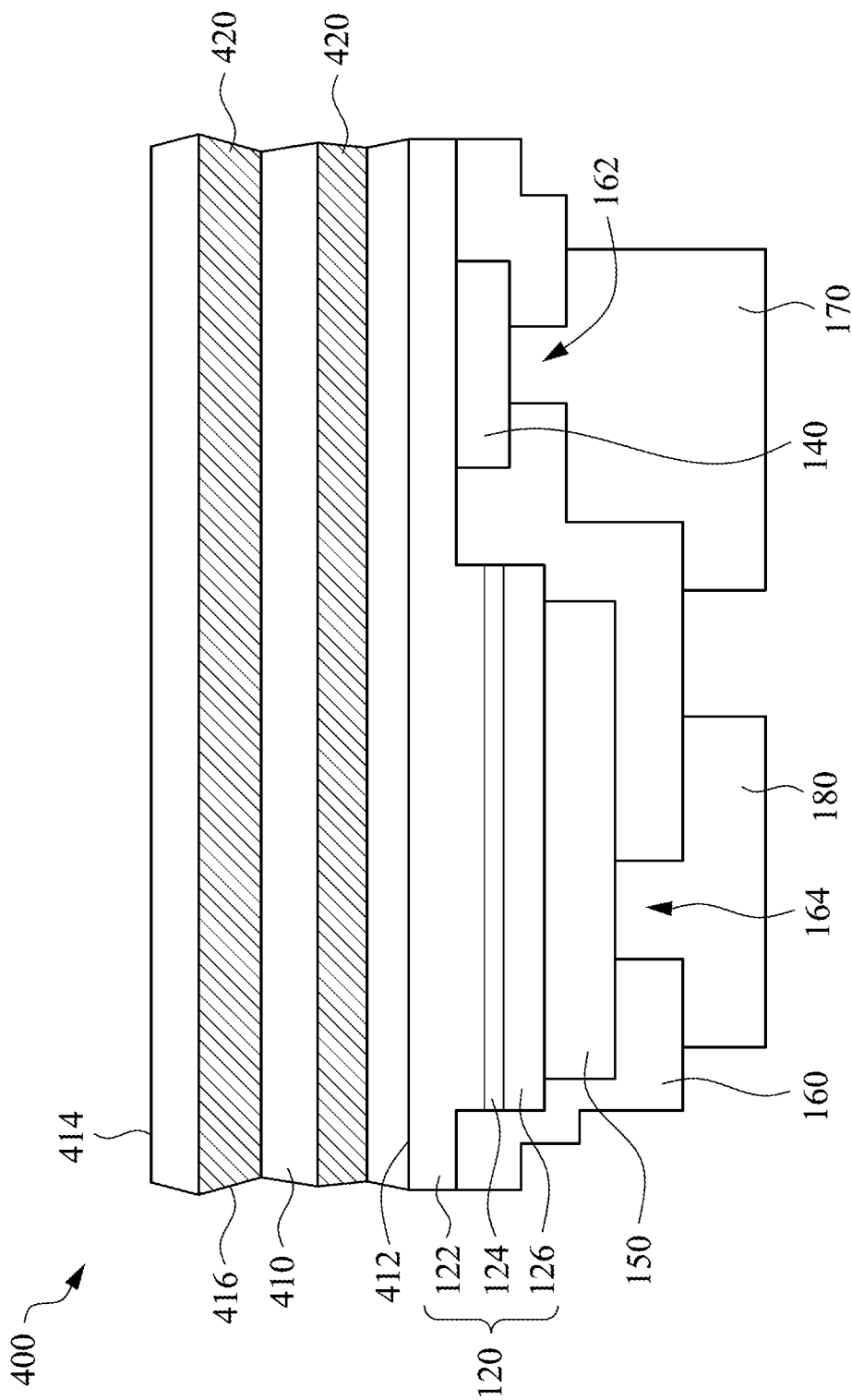
FIG. 4 is a schematic cross-sectional view of an UV LED in accordance with one embodiment of the present invention.

Referring to FIG. 4, a schematic cross-sectional view of an UV LED in accordance with one embodiment of the present invention. The structure of the UV LED 400 is substantially the same as that shown in FIG. 3, and the differences are that a plurality of stealth dicing marks 420 are formed on a transparent substrate 410 of the UV LED 400, and no three-dimensional structure is disposed on a surface of the transparent substrate 410.

In the UV LED 400, the transparent substrate 410 similarly has a first surface 412, an opposite second surface 414, and several side surfaces 416 surrounding and disposed between the first surface 412 and the second surface 414. A plurality of stealth dicing marks 420 are formed in different depths inside the transparent substrate 410 by using a laser stealth dicing technique to respectively form fissures inside the transparent substrate 410. A tensile force is then applied to expand these fissures and divide a wafer into individual UV LEDs 400. Accordingly, the stealth dicing marks 420 may be longitudinally arranged on the side surfaces 416 of the transparent substrate 410. These stealth dicing marks 420 can increase refraction of the ultraviolet light inside the UV LED 400, and decrease total reflection of the ultraviolet light on the side surfaces 416 of the transparent substrate 410, thereby enhance lateral light extraction efficiency of the UV LED 400.

With a specific arrangement of the stealth dicing marks, the dicing marks are connected to each other to extend the fissures toward a specific direction while cleaving, so as to split individual UV LEDs into a specific shape, thereby increasing versatility of packaging process hereafter.

Although the UV LED 400 shown in FIG. 4 does not have the transparent structure 130a or 130b as shown in FIG. 1A or FIG. 1B, nor three-dimensional structures 320 as shown in FIG. 3, nor an increased thickness of the transparent substrate 410, these features may be added to further enhance light extraction effect of the UV LED 400 in other embodiments of the present invention.

Figure 5:
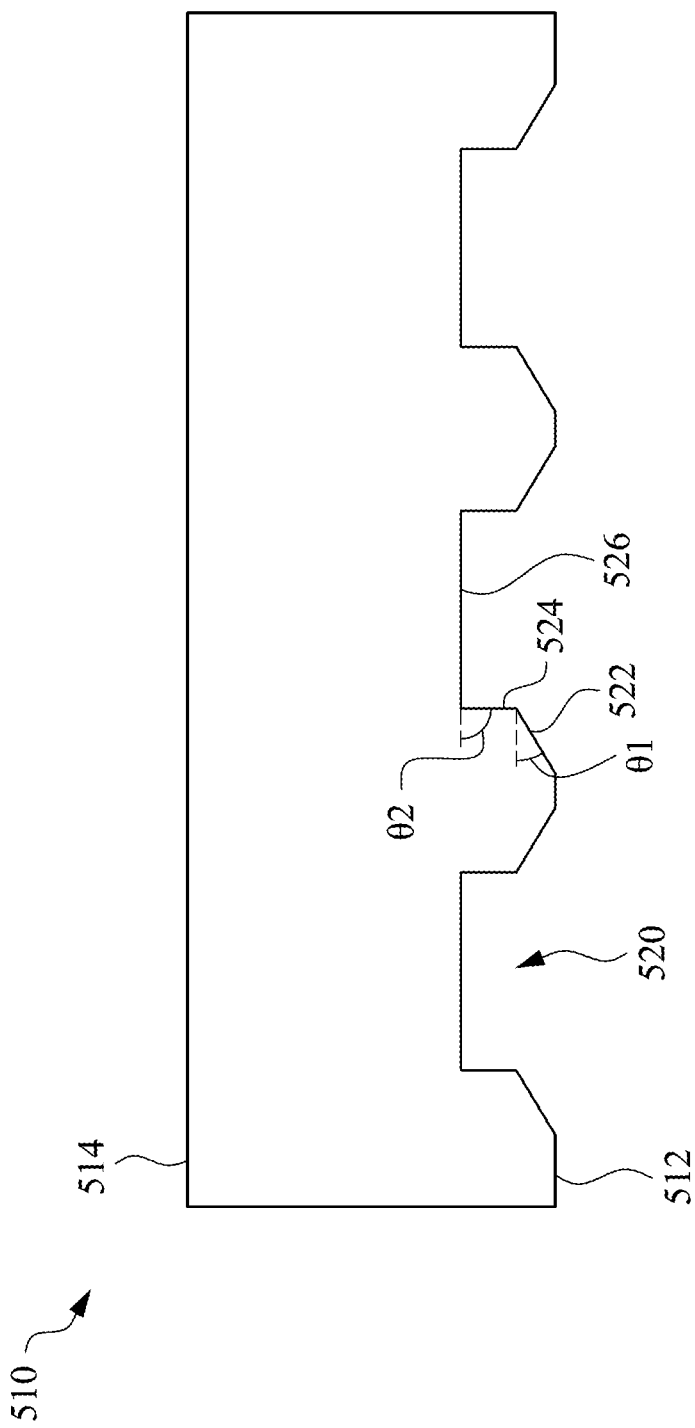
FIG. 5 is a schematic cross-sectional view of a transparent substrate in accordance with one embodiment of the present invention.

Referring to FIG. 5, a schematic cross-sectional view of a transparent substrate in accordance with one embodiment of the present invention. A transparent substrate 510 may replace the transparent substrates 110, 210, 310, and 410 of the aforementioned embodiments. The transparent substrate 510 includes a first surface 512 and an opposite second surface 514. The material of the transparent substrate 510 may be, for example, sapphire, aluminum nitride, or silicon carbide. An ultraviolet illuminant epitaxial structure may be grown on the first surface 512 of the transparent substrate 510. The first surface 512 of the transparent substrate 510 is set with a plurality of cavities 520.

In some embodiments, the cavities 520 are separated from each other and are repeated with a predetermined pitch, i.e. are periodically arranged. For example, the predetermined pitch may be from about 0.5 µm to about 5 µm. As shown in FIG. 5, in some embodiments, each of the cavities 520 includes a first inclined surface 522, a second inclined surface 524, and a bottom surface 526. The first inclined surface 522 is adjacent and connected to the second inclined surface 524, and the second inclined surface 524 is adjacent and connected to the bottom surface 526. The first inclined surface 522 has a first angle θ1 with respect to the bottom surface 526, and the second inclined surface 524 has a second angle θ2 with respect to the bottom surface 526, in which the first angle θ1 is different from the second angle θ2. In some embodiments, the first angle θ1 is smaller than the second angle θ2. For example, the first angle θ1 may be from about 30 degrees to about 90 degrees, and the second angle θ2 may be from about 75 degrees to about 90 degrees.

Each of the cavities of the transparent substrate of the present embodiment may include not only two inclined surfaces, but each of the cavities may include three or more inclined surfaces.

By periodically arranging the cavities 520 on the first surface 512 of the transparent substrate 510, quality of an ultraviolet illuminant epitaxial structure grown on the first surface 512 is enhanced, thereby increasing yield rate of the ultraviolet illuminant epitaxial structure and leading to cost savings.

According to the aforementioned embodiments, one advantage of the present invention is that light extraction is increased with increased refraction of the light inside the UV LED by including a transparent structure disposed between a transparent substrate and air, wherein a refractive index of the transparent structure is therebetween.

Another advantage of the present invention is that a surface of a transparent substrate includes a plurality of three-dimensional structures that destruct total reflection surfaces of light inside the UV LED, such that light extraction rate of the UV LED is enhanced.

Yet another advantage of the present invention is that a transparent substrate of an UV LED is increased to have a height being greater than a length and/or a width, such that a lateral light-exiting area of the UV LED is increased, thereby overall light extraction of the UV LED is enhanced.

Yet another advantage of the present invention is that several dicing marks are arranged longitudinally on side surfaces of a transparent substrate by stealth dicing. These stealth dicing marks increase roughness of the side surfaces of the transparent substrate, such that a lateral light extraction rate of an UV LED is enhanced. With a specific arrangement of the stealth dicing marks, fissures are gradually expanded to be connected to each other while cleaving, such that individual UV LEDs are divided into a specific shape along dicing mark directions, thereby increasing versatility of packaging process hereafter.

Although the present invention has been described in considerable details with reference to certain embodiments, the foregoing embodiments of the present invention are illustrative of the present invention rather than limiting of the present invention. It will be apparent to those having ordinary skill in the art that various modifications and variations can be made to the present invention without departing from the scope or spirit of the invention. Therefore, the spirit and scope of the appended claims should not be limited to the description of the embodiments contained herein.

What is claimed is:

1. An ultraviolet light-emitting diode, comprising:
    a transparent substrate comprising a first surface, an opposite second surface, and a plurality of side surfaces surrounding and disposed between the first surface and the second surface, wherein the first surface of the transparent substrate is formed with a plurality of cavities, the cavities are repeated with a predetermined pitch, wherein each of the cavities comprises a first inclined surface, a second inclined surface, and a bottom surface, the first inclined surface is adjacent and connected to the second inclined surface, the second inclined surface is adjacent and connected to the bottom surface, the second inclined surface is connected between the first inclined surface and the bottom surface, the first inclined surface and the second inclined surface respectively have a first angle and a second angle with respect to the bottom surface, and the first angle and the second angle are different from each other;
    an ultraviolet illuminant epitaxial structure disposed on the first surface of the transparent substrate; and
    a transparent structure comprising a light-entering surface and a light-exiting surface which are opposite to each other; wherein the light-entering surface of the transparent structure is adjacent to the second surface of the transparent substrate; and a refractive index of the transparent structure is between a refractive index of the transparent substrate and a refractive index of air, and wherein a height of the ultraviolet light-emitting diode is greater than a length and/or a width of the ultraviolet light-emitting diode.

2. The ultraviolet light-emitting diode of claim 1, wherein the refractive index of the transparent structure is decremented from the light-entering surface toward the light-exiting surface.

3. The ultraviolet light-emitting diode of claim 1, wherein the transparent structure comprises a plurality of transparent films stacked on the second surface of the transparent substrate in sequence, and the transparent films have different refractive indexes.

4. The ultraviolet light-emitting diode of claim 1, wherein a thickness of the transparent structure is smaller than 1 µm.

5. The ultraviolet light-emitting diode of claim 1, wherein a material of the transparent structure comprises oxide, nitride, or fluoride.

6. The ultraviolet light-emitting diode of claim 1, wherein the side surfaces of the transparent substrate are formed with a plurality of stealth dicing marks which are arranged longitudinally.

7. An ultraviolet light-emitting diode, comprising:
a transparent substrate comprising a first surface, an opposite second surface, and a plurality of side surfaces surrounding and disposed between the first surface and the second surface, wherein the second surface of the transparent substrate has a plurality of three-dimensional structures, the first surface of the transparent substrate is formed with a plurality of cavities, the cavities are repeated with a predetermined pitch, wherein each of the cavities comprises a first inclined surface, a second inclined surface, and a bottom surface, the first inclined surface is adjacent and connected to the second inclined surface, the second inclined surface is adjacent and connected to the bottom surface, the second inclined surface is connected between the first inclined surface and the bottom surface, the first inclined surface and the second inclined surface respectively have a first angle and a second angle with respect to the bottom surface, and the first angle and the second angle are different from each other;

an ultraviolet illuminant epitaxial structure disposed on the first surface of the transparent substrate; and
a transparent structure disposed over the three-dimensional structures, wherein a refractive index of the transparent structure is between a refractive index of the transparent substrate and a refractive index of air, and wherein a height of the ultraviolet light-emitting diode is greater than a length and/or a width of the ultraviolet light-emitting diode.

8. The ultraviolet light-emitting diode of claim 7, wherein the three-dimensional structures have the same shape and size, and the three-dimensional structures are repeated with a predetermined pitch.

9. The ultraviolet light-emitting diode of claim 7, wherein the three-dimensional structures are scattered on the second surface of the transparent substrate.

10. The ultraviolet light-emitting diode of claim 7, wherein the three-dimensional structures are formed by diamond cutting, laser cutting, laser stealth dicing, etching, or a combination thereof.

11. The ultraviolet light-emitting diode of claim 7, wherein the transparent structure has a light-entering surface and a light-exiting surface which are opposite to each other; the light-entering surface is adjacent to the second surface of the transparent substrate; and the refractive index of the transparent structure is decremented from the light-entering surface toward the light-exiting surface.

12. The ultraviolet light-emitting diode of claim 7, wherein the transparent structure has a light-entering surface adjacent to the second surface of the transparent substrate, and a light-exiting surface opposite to the light-entering surface; the transparent structure comprises a plurality of transparent films stacked on the second surface of the transparent substrate in sequence, the transparent films have different refractive indexes.

13. The ultraviolet light-emitting diode of claim 7, wherein a thickness of the transparent structure is smaller than 1 µm.

14. The ultraviolet light-emitting diode of claim 7, wherein the side surfaces of the transparent substrate are formed with a plurality of stealth dicing marks which are arranged longitudinally.

* * * * *